United States Patent
Aphek et al.

(10) Patent No.: US 8,121,158 B2
(45) Date of Patent: Feb. 21, 2012

(54) OPTICAL PROJECTION SYSTEM AND METHOD FOR A COOLED LIGHT SOURCE

(75) Inventors: Ori Aphek, Givataim (IL); Gil Tidhar, Modiin (IL)

(73) Assignees: Elta Systems Ltd., Ashdod (IL); Optigo Systems, Ltd., Lod (IL)

(*) Notice: Subject to any disclaimer, the term of this patent is extended or adjusted under 35 U.S.C. 154(b) by 648 days.

(21) Appl. No.: 12/095,446

(22) PCT Filed: Nov. 29, 2006

(86) PCT No.: PCT/IL2006/001378
§ 371 (c)(1),
(2), (4) Date: May 29, 2008

(87) PCT Pub. No.: WO2007/063542
PCT Pub. Date: Jun. 7, 2007

(65) Prior Publication Data
US 2008/0291954 A1  Nov. 27, 2008

(30) Foreign Application Priority Data
Nov. 29, 2005 (IL) .......................................... 172240

(51) Int. Cl.
*H01S 3/04* (2006.01)
(52) U.S. Cl. ........................................... 372/34; 372/35
(58) Field of Classification Search ............... 372/34–36
See application file for complete search history.

(56) References Cited

U.S. PATENT DOCUMENTS

| | | | | |
|---|---|---|---|---|
| 3,751,166 | A * | 8/1973 | Starkey et al. | 356/5.04 |
| 4,873,843 | A | 10/1989 | Volten | |
| 5,408,100 | A * | 4/1995 | Gallivan | 250/352 |
| 5,628,196 | A * | 5/1997 | Farmer | 62/51.1 |
| 5,651,016 | A | 7/1997 | Yu et al. | |
| 5,742,384 | A * | 4/1998 | Farmer | 356/141.4 |
| 6,195,372 | B1 * | 2/2001 | Brown | 372/34 |
| 2002/0196820 | A1 * | 12/2002 | Sato et al. | 372/29.02 |
| 2006/0018609 | A1 * | 1/2006 | Sonoda et al. | 385/93 |

FOREIGN PATENT DOCUMENTS

JP   A-61-127189   6/1986

* cited by examiner

*Primary Examiner* — Jessica Stultz
*Assistant Examiner* — Phillip Nguyen
(74) *Attorney, Agent, or Firm* — Oliff & Berridge, PLC (57) ABSTRACT

A light projection optical system is presented. The system comprises a cooling chamber containing: a light source operative at a cool temperature being lower than 240K; a cooler unit capable of cooling said light source to said cool temperature during the light source operation,- an optical window permitting light emergence outside from the cooling chamber; and an optical unit accommodated in the optical path of light emitted by said light source and enabling emergence of this light through said optical window outside from the cooling chamber.

32 Claims, 5 Drawing Sheets

OPTICAL PROJECTION SYSTEM AND METHOD FOR A COOLED LIGHT SOURCE

FIELD OF THE INVENTION

This invention is generally in the field of optical projection systems used with a cooled light source. The invention is particularly useful for optical projection systems used with either one or multiple infrared (IR) semiconductor lasers cooled to cryogenic temperatures.

BACKGROUND OF THE INVENTION

There are many applications of mid- and far-infrared lasers, including inter alia trace-gas sensing, air pollution monitoring, medical devices (for diagnostics or treatment), optical communications, and spectroscopy. In most of these applications, high radiation intensity is an important requirement. Another typical requirement is that radiation emitted by a laser is to be appropriately collimated or projected. A frequent requirement for improving the performance of semiconductor lasers, especially those operating in mid- and far-infrared spectra, is to cool the lasers, often to cryogenic temperatures (below −100° C. or 170K). In view of these and other requirements, lasers are often used as components of larger optical systems, configured for optimal laser operation and optimal projection of the produced light.

Concerning the mid- and far-infrared semiconductor lasers, these lasers are attractive because they are, generally, cheaper as well as more compact and power-efficient than of other types, although their radiation intensity is not as high as of, for example, wavelength-shifted solid-state lasers. Examples of mid- and far-infrared semiconductor lasers are Quantum Cascade Lasers (QCLs), Interband Cascade Lasers (ICLs), and direct-bandgap antimonide lasers. These lasers may be pumped optically or electrically.

Various cooling and cryogenic cooling schemes for lasers have been developed. An example of a cryogenic cooling apparatus employing heat sink and diffuser plate for cooling small objects is described in U.S. Pat. No. 5,628,196.

For some particular applications, operation with more than one laser is needed; and all of these lasers may require a refrigerated environment. For example, U.S. Pat. No. 4,873,843 discloses a refrigerated environment for multiple laser sources and/or sensors which provides the same thermal conditions in a single cold-cycle refrigerator for the sensors and sources; and a mounting structure which comprises a cold-head assembly accommodating plural sensors or sources and positions them for radiation transfer with the ambient while they are held at consistent temperature relationships for efficient operation.

SUMMARY OF THE INVENTION

There is a need in the art to provide an efficient light projection system and method for use with a light source requiring cooling and to facilitate the operation and assembling of such optical system, while not damaging the radiation produced by the cooled light source.

The inventors have found that conventional light projection systems used with a light source requiring cooling to a temperature below −30° C., typically laser based optical systems including at least one semiconductor laser inside a cooler and optics (typically collimating optics), suffer from the fact that the optics is located outside the cooler. This results in the system's vulnerability to vibrations (e.g., caused by a cooler motor) reducing the alignment of optical elements with respect to the laser based light source. The alignment is also negatively affected by the temperature difference between the optics and the light source, due to the effect of thermal expansion and variations of the optics temperature. Moreover, locating the optics out of the cooler (or, more precisely, out of the cooling chamber or dewar for cryogenic applications), results in that the optics is distant from the laser source and must therefore be relatively large.

In case of the light source including multiple lasers, the lasers and also their associated optical elements would become too distantly located from each other to ensure that each laser is located at the focal point of the respective optical element. Also the distance between the multiple lasers would need to be larger considering the use of large optics located outside the cooling chamber. Hence, the cooling chamber may need to be larger to contain the multiple lasers. This negatively affects the cooling efficiency, because the cooling chamber of a larger mass needs to be cooled.

In fact, in most of cryogenic applications, a larger portion of the cooling capacity (in watt) of a cooler is invested in overcoming the inefficiencies of the dewar itself, rather than in cooling a useful load which is located in the dewar. In laser applications the typical inefficiencies of the dewar itself include heat conduction through electrical wires, radiation through an optical window, residual convection to the walls, the thermal mass of the dewar structure, etc. For example the cumulative effect of these inefficiencies can be of about 150-300 mW, whereas the useful load would be just tens of mW. Hence it can be seen that in many cases coolers are very inefficient, and optical systems used with such coolers can be inefficient also. The present invention can improve this situation in some cases by losing efficiency while adding mass to the useful load, but regaining it by decreasing the size of the cooler itself.

Thus, the invention can be useful in various applications of mid- and far-infrared lasers, i.e., inter alia, in trace-gas sensing, air pollution monitoring, medical devices (for diagnostics or treatment), optical communications, and spectroscopy. The invention is particularly useful in electrooptic systems, for example in airborne and spaceborne systems.

According to some embodiments of the invention, the optical system contains only one single laser. The optical system (more particularly its cooling chamber) also contains therein a single lens or a plurality of optical elements associated with this laser. In some other embodiments, the cooling chamber contains therein multiple lasers.

According to one broad aspect of the present invention, there is provided a novel light projection optical system configured for improved performance. The system includes a cooling chamber which contains: a light source operative at a cool temperature being lower than 240K; a cooler unit capable of cooling said light source to this cool temperature during the light source operation; an optical window permitting light emergence outside from the cooling chamber; and an optical unit accommodated in the optical path of light emitted by the light source lo and enabling emergence of this light through the optical window outside from the cooling chamber.

According to another broad aspect of invention, the optical system preferably operates with at least one laser. Using different light sources may also be possible. The laser may be a semiconductor laser.

According to another broad aspect of invention, the cooling chamber may include a vacuum sealed housing which contains the light source. Thereby configured system can provide a higher efficiency due to smaller heat transfer to the inside of the vacuum sealed housing by convection. Moreover, if an inner surface of the vacuum sealed housing has an emissivity at the temperature of operation lower than 0.3, the system can provide for a higher efficiency due to smaller heat transfer to the inside of the vacuum sealed housing by radiation. To decrease the emissivity of the inner surface of the vacuum sealed housing, this inner surface may be polished.

According to another broad aspect of invention, the optical unit used in the system of the present invention preferably includes at least one converging lens.

According to another broad aspect of invention, the cooling chamber may contain a support assembly carrying the light source and the optical unit. This support assembly may be mounted on a cool finger, which will thermally couple the support assembly to the cooler unit, and enable the heat withdrawal. The vacuum housing may contain a cold shield assembly configured to absorb thermal radiation emitted by the light source and the support assembly. Such a cold shield assembly is preferably thermally coupled to the cold finger for the heat withdrawal. It also has a window permitting the passage of the produced light outside of the cooling chamber.

According to another broad aspect of invention, the optical unit includes an optical element located at an output facet of the support assembly. This optical element can facilitate achieving a desired projection or optical path of a light beam emitted by the light source. The support assembly may have an array of at least two spaced-apart compartments containing multiple lasers of the light source. The optical unit may include multiple optical elements located at the output facets of said compartments so that these optical elements will be in the optical paths of laser beams emitted by the lasers. Each of the compartments may contain an array of the lasers, a corresponding array of the optical elements being located at the output of the compartment.

According to another broad aspect of invention, the optical unit includes a plurality of lenses. Each of the lenses is associated with a corresponding one of lasers of the light source.

According to another broad aspect of invention, the optical window is covered with an antireflective coating preventing back reflections of the laser radiation. The may be oriented in respect to the optical path of the light emitted by the light source with a certain angle, preventing light back reflections.

According to another broad aspect of invention, the optical unit includes one or more optical elements associated with one or more lasers for affecting the divergence and/or the angle of propagation of one or more laser beams. These optical elements preferably carry out one of the following: collimation, focusing, and reducing the beam divergence. In particular, these optical elements may focus at least one laser beam in one or two dimensions.

According to another broad aspect of invention, the system includes a wavelength-selective filter unit configured and operable for transmitting a wavelength range at and around that emitted by the light source, while reflecting all other wavelengths. The filter unit may be a stack of dielectric materials with different indices of refraction and/or thicknesses.

According to another broad aspect of invention, the system may include multiple semiconductor lasers arranged in a one-, two-, or three-dimensional array. In particular, some or all of the multiple semiconductor lasers may be arranged in a monolithic semiconductor laser bar.

According to another broad aspect of invention, the light source includes a semiconductor laser emitting in at least one of mid and far infrared wavelength range. The light source may include at least two lasers having substantially different emission spectra.

According to another broad aspect of invention, the optical system may include an optical fiber unit, optically coupled to the optical window of the cooling chamber, to collect some or all of the light emerging therefrom. The fiber unit includes at least one multimode fiber collecting at least two of laser beams emitted by multiple lasers.

According to another broad aspect of invention, the optical unit projects at least two beams in at least two substantially parallel laser beams. The substantially parallel laser beams may include beams with directions diverging not more than 1 degree. The optical unit may focus at least two laser beams into intersecting focus spots.

According to another broad aspect of invention, the optical system may include a light beam expander unit accommodated at a light output of the cooling chamber (outside thereof) and configured to carry out at least one of the following: diverging a light beam projected from the cooling chamber or increasing this light beam width. Though, the light beam expander unit may carry out at least one of the following: converging a light beam projected from the cooling chamber or decreasing the light beam width.

The beam expander unit may have optical elements movable with respect to each other, thereby allowing for changing at least one of a focal plane and a direction of the light beam projected from the cooling chamber. Thus, such beam expander can enable for compensating for alignment inaccuracies inside the cooling chamber.

Also, the beam expander unit may be movable with respect to the cooling chamber, thereby allowing for changing at least one of a focal plane and a direction of said light beam projected from the cooling chamber. Such beam expander unit also can thereby enable for compensating for alignment inaccuracies inside the cooling chamber.

The beam expander unit may include a single magnification unit for all the light beams emerging from the cooling chamber. The magnification unit may include a first lens configured for focusing at least one of the laser beams, and a second lens, of a larger focal distance, for collimating the focused laser beam. The beam expander unit may include a first and a second sets of deflectors, the first set of deflectors operating for directing light beams emerging from the cooling chamber onto the second set. The deflector may be configured and operable to increase spaces between the multiple parallel laser beams emerging from the cooling chamber.

According to another broad aspect of invention, the optical unit may include an optical element made from at least one of the following materials: germanium, ZnSe, ZnS, $CaF_2$, silicon, sapphire, fused silica, and quartz. The optical window may be a surface region of the cooling chamber made from at least one of the following materials: germanium, ZnSe, ZnS, $CaF_2$, $BaF_2$, silicon, sapphire, fused silica, and quartz.

According to another broad aspect of invention, the light source may include a semiconductor laser emitting in 3-5 micron wavelength range. The light may include a Quantum Cascade Laser or an InP based laser with AlInAs/GaInAs active layers. The semiconductor laser based light source may include multiple semiconductor lasers.

According to another broad aspect of invention, the cooling unit is a Stirling or Joule-Thompson or Pulse Tube cryogenic cooling unit.

According to another broad aspect of invention, the temperature of the light source operation can be lower than 170K or even lower than 140K According to yet another broad aspect of invention, there is provided a novel laser module for use in an projection optical system utilizing a cooled semiconductor laser based light source. The laser module can include: a support assembly including at least two spaced-apart compartments each containing at least one semiconductor laser, and an optical unit including optical elements mounted at the output facets of said compartments. The laser module can be configured to be mountable inside a cooling chamber of an inner diameter being less than 3 cm.

According to yet another broad aspect of invention, there is provided a novel method for use in producing a desired projection of light, for light produced by a light source operating at a temperature lower than 240K. The method includes a step of at least partially converging at least one beam of the produced light before this beam emerges from a cooling chamber. In particular, the method can utilize passing the beam through a converging lens. The method may include passing the light output from the cooling chamber through a beam expander unit. The method may include cryogenically cooling the inside of the cooling chamber. The method may include maintaining vacuum conditions within the cooling chamber.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF EXEMPLARY EMBODIMENTS

Figure 1:
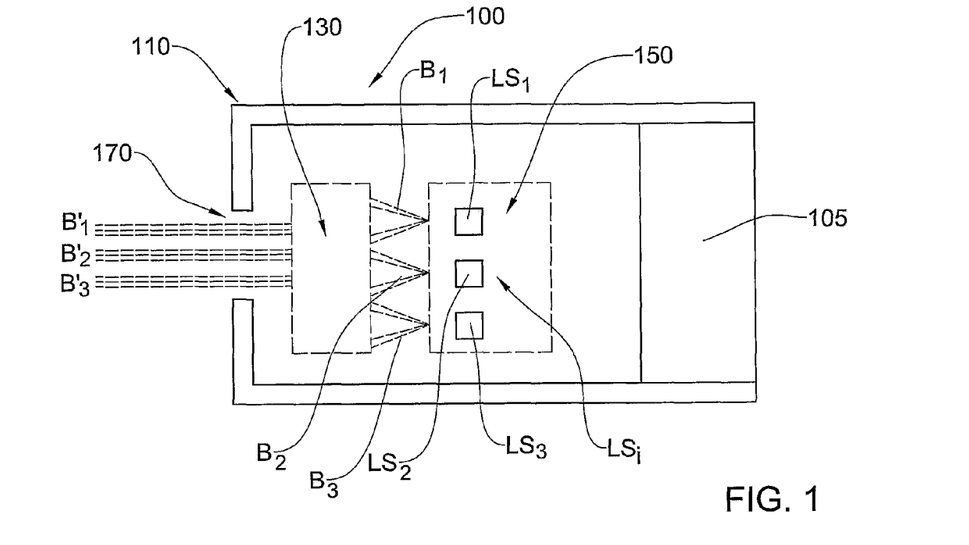
FIG. 1 schematically illustrates an example of a cooling system of the present invention for a semiconductor laser based light source.

Reference is made to FIG. 1, illustrating an example of an optical system 100 configured according to the invention for a semiconductor laser based light source. System 100 includes a cooling chamber 110 containing a light source 150 formed by at least one semiconductor laser, generally at $LS_i$, three lasers $LS_1$, $LS_2$, and $LS_3$ being seen in the figure; an optical window 170, and an optical unit 130. The cooling chamber can be configured as a vacuum or low-pressure chamber.

Light source 150 is associated with a cooler assembly 105 operable to maintain a desired temperature of the lasers. Cooler assembly 105 is, for example, configured as a mechanical system that approximates the ideal gas cycle and is fed by electricity. Preferably, the use of a cryogenic cooler assembly is considered. Preferably, this cooler is capable of providing to the light source a cooling capacity of a hundred of milliwatts to several watts or higher. Also, preferably, this cooling capacity can be provided at a temperature as low as 240K, more preferably at a temperature as low as 170K, and even more preferably at a temperature as low as 140K or lower. The temperature of 170K defines the limit of cryogenic temperatures for the purposes of this patent application. Preferably, the cooler assembly is of a one of three types: Stirling, Joule Thompson, or Pulse Tube. For example, the cooler may be one of RICOR's cryogenic coolers (www.ricor.com). Other general types of cryogenic coolers suitable for use with the present invention include Active Transport, Reverse Brayton, Active Refrigerator, Vuilleumier, and those capable of providing an appropriate cooling capacity at cryogenic temperatures needed for operation of semiconductor lasers.

Optical unit 130 is located inside chamber 110 so as to be in the optical path of light beams $B_1$, $B_2$ and $B_3$ emitted by lasers $LS_1$, $LS_2$ and $LS_3$, respectively. Optical unit 130 is configured as collimating optics to collimate these beams and direct them out of the cooling chamber through appropriately provided optical window 170. Resulting output beams, $B'_1$, $B'_2$, and $B'_3$, emerging from the cooling chamber 110, are substantially parallel to each other. Optical system 100 is thus configured and operable operation with cooled multiple semiconductor lasers and for affecting the propagation of multiple laser beams inside the cooling chamber, so as to provide a desired laser beams propagation scheme when emerging from the cooling chamber.

It should be noted, although not specifically shown, that system 100 may include an optical fiber unit optically coupled to the light output of cooling chamber 110. Such a fiber unit may include one or more multimode fibers for collecting two or more of the laser beams.

Figure 2:
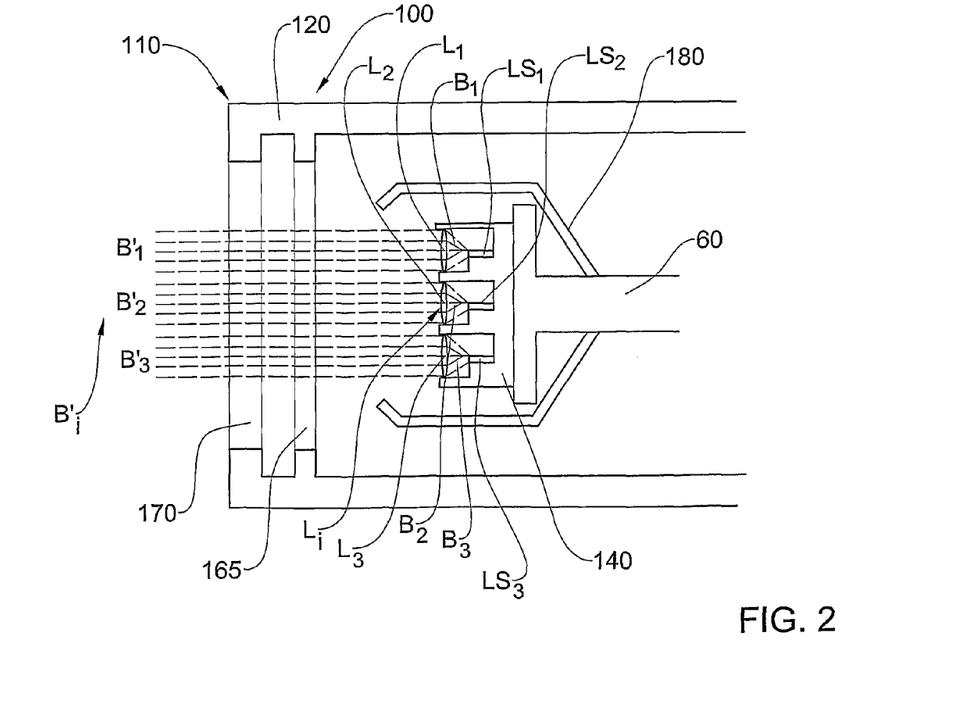
FIG. 2 shows a more specific example of the cooling system of FIG. 1.

With reference to FIG. 2, there is shown a more specific example of optical system 100 configured according to the invention for a semiconductor laser based light source. To facilitate understanding, the same reference numbers are used for the same features in different examples of the invention. Chamber 110 includes a thermo insulated housing (e.g. dewar) 120 formed with an optical window 170. Such a window may be constituted by an aperture made in the respective facet of the housing, or a region of the facet optically transparent with respect to the operative wavelength range of the lasers, or an optical element mounted in an opening made on the facet of the housing. Window 170 is also configured to provide a sealing required for the proper dewar performance.

Mounted inside housing 120 is a cold-finger 60 connected to a cryogenic cooler (not shown), and a support assembly (mount) 140 configured according to the invention to be attachable to the cold-finger. The support assembly is configured for carrying lasers $LS_1$, $LS_2$, $LS_3$ of the laser based light source, and in the present example, is also configured for carrying optical elements (lenses) $L_i$ of the optical unit— three such elements $L_1$, $L_2$, $L_3$ being shown in the figure. In system 100, heat generated by the light source is withdrawn first to support assembly 140, then to cold-finger 60, and finally to the cryogenic cooler.

Preferably, the invention is used with semiconductor lasers emitting radiation in mid or far infrared wavelength range, but generally any other operative wavelength range can be used. Preferably, these semiconductor lasers are Quantum Cascade Lasers, InP based with AlInAs/GaInAs active layers. Lasers radiation spectra may overlap. A number of these emitters may be monolithically integrated in a laser bar.

Cooling chamber 110 preferably also contains a cold shield assembly 180 configured for absorbing thermal radiation emitted by the light source and the support assembly. Cold shield assembly 180 is thermally coupled to cold finger 60 whereto heat generated by the dissipating thermal radiation is transferred. As shown in the figure, cold shield assembly 180 is configured to define a window permitting the passage of the laser beams therethrough, and to surround support assembly 140.

Further provided in system 100 is a filter assembly 165 accommodated inside cooling chamber 110 so as to be in the optical path of laser beams $B_i$ emerging from lenses $L_i$. Filter assembly 165 is configured as a wavelength-selective filter for rejecting external infrared radiation which dissipates into heat in the internal parts of the cooling chamber. Such a filter may be configured as a stack of dielectric materials with different thicknesses and/or indices of refraction. As light passes through this stack, wavelengths, that are to be rejected, experience subtractive interference. This arrangement functions as a narrow band pass filter which transmits only a narrow band of wavelengths at and around the wavelength of the laser itself, while reflecting all other wavelengths.

Laser beams $B_i$, emitted by the lasers $LS_i$ of the light source, propagate through lenses $L_i$ associated with the lasers. Lenses $L_i$, constituting optical elements of the optical unit, are aligned with the lasers and in the present example are mounted on support assembly 140. Generally, optical elements may deflect, collimate, or focus the light beams, or increase or decrease the beams divergence. It should be noted that by an effect of beams collimation, either an effect of deflection of beams to make them parallel or an effect of increasing of the beams divergence is considered. Considering laser radiation of mid or far infrared wavelength range (e.g. 3 to 5 microns), lenses $L_i$, which are to be transparent to this radiation, may be made for example from germanium, ZnSe, ZnS, ClearTran® (water clear zinc sulfide), $CaF_2$, $BaF_2$, silicon, sapphire, fused silica or quartz. The lenses may be realized using refractive, reflective or diffractive optics, or a combination of them.

Laser beams $B'_i$ (collimated beams) emerge from housing 120 through window 170. Generally, the window may be configured as a wavelength selective filter thus eliminating a need for filter 165, but preferably and especially considering the filter implemented as a stack of dielectric materials, such a filter structure is a separate element 165 while window 170 provides the filtered beams' passage therethrough and serves for a low quality sealing of the cooling chamber.

The fixation of optical unit 130 on the same support assembly 140 with laser light source 150 allows for providing an adequate alignment between the optical elements of the optical unit and the emitting lasers of the laser light source. As a result, beams $B'_i$ emerging from the chamber are parallel and collimated. Despite that lenses $L_i$ are placed inside the chamber, the resulting cooling system efficiency is high, because the cooling system requires less space. Indeed, the divergence of laser light propagating from the laser source to window 170 is reduced. Hence, the size of the window may be decreased.

It is important to prevent the filter and the window of the cooling chamber from reflecting laser light back to the laser, because such back-reflections may negatively affect the laser operation. Undesired reflections may be prevented by covering the filter and/or the window with an antireflective coating, usually able to increase the light propagation throughput beyond 99%, or may be prevented by orienting the filter and/or the window in non-right angles to the laser light. Also, covering the lenses and other transmitting optical elements with antireflective coating will allow to avoid heating their surfaces and to maximize the light throughput.

The energy required for cooling the chamber increases with the size of the cooled devices inside the chamber, owing to the effect of the blackbody radiation. In the described configuration, the lenses may be small (of the order of 1-10 mm), either because a narrow waist is acceptable, or because a beam expander is placed out of the chamber. The total diameter of the chamber may be of the order of 1-2 cm (i.e. small).

Figures 3, 4A:
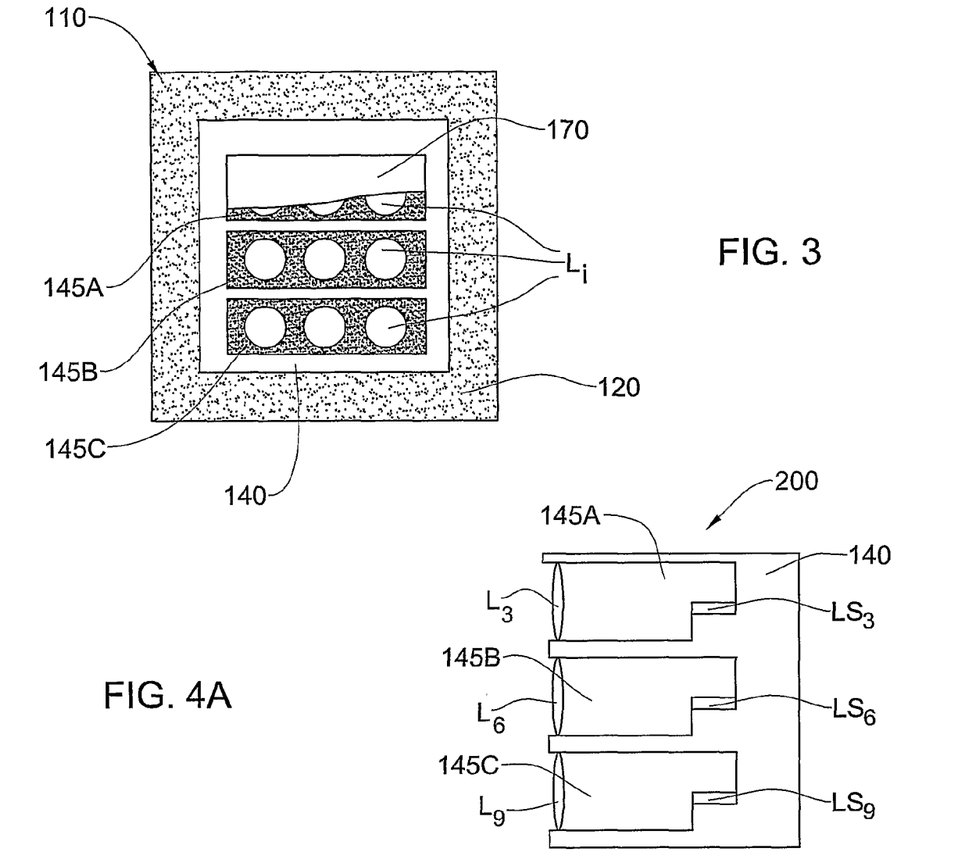
FIG. 3 shows a front view of a cooling chamber of the present invention, with a two-dimensional array of lenses (optical elements) in front of a two-dimensional array of lasers, respectively.
FIGS. 4A and 4B show an example of a laser module of the present invention, with a two-dimensional array of lenses (optical elements) in front of a two-dimensional array of lasers and mountable inside a cooling chamber.

With reference to FIG. 3, there is shown a front view of cooling chamber 110. Support assembly 140 is configured to define an array of compartments—three such compartments 145A, 145B, 145C in the present example, and lenses $L_i$ are mounted at the output facets of these compartments to be in the optical path of light beams emitted by the lasers (which are not shown here). Lenses $L_i$ are located in a common plane (the lasers behind the lenses are also located in their associated common plane) and are arranged in a two dimensional array—three lenses in each of three rows in the present example. A part of window 170, allowing output light passage and possibly providing a sealing to the chamber, is also shown here.

Other embodiments may utilize lenses (as well as lasers) configured in a one-dimensional array or another two-dimensional array (e.g., circular array), or in a three-dimensional array when the support assembly allows for a non-planar configuration. The lasers may be arranged as bars of monolithic emitters.

It should be noted that the lasers, support assembly and optics may be configured to direct different laser beams along parallel or non-parallel axes. The lenses may focus laser beams in one or two dimensions, i.e. in a point or in a line. Any focal point may be common for two or more laser beams.

Figure 4B:
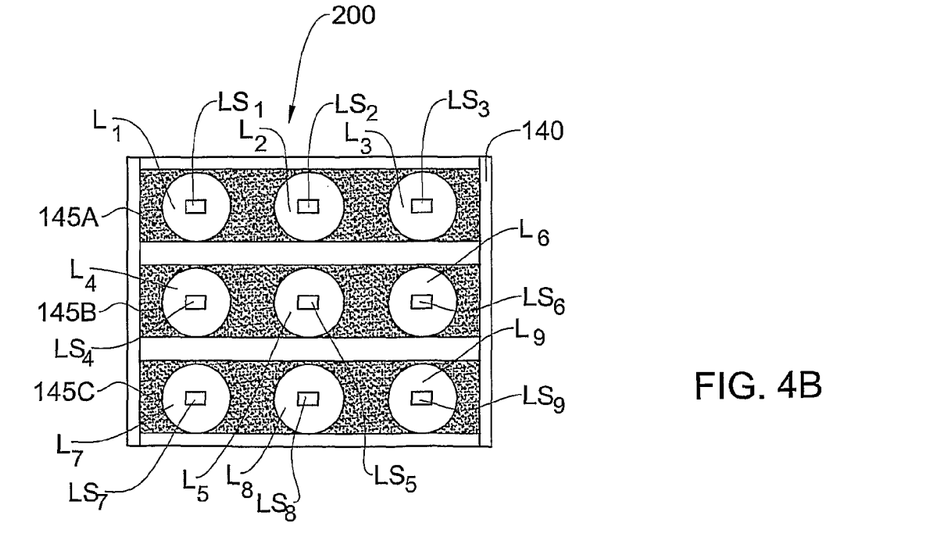

Reference is made to FIGS. 4A and 4B, exemplifying the configuration of a laser module 200 of the present invention mountable inside a cooling chamber which has an optical window for allowing passage of electromagnetic radiation of a predetermined wavelength range. FIGS. 4A and 4B show the side and front views, respectively of laser module 200.

Laser module 200 includes a support assembly 140 having three spaced-apart compartments 145A-145C, each containing three semiconductor lasers and three lenses. FIG. 4B shows all nine lasers $LS_1$-$LS_9$ contained in the compartments and their associated lenses $L_1$-$L_9$ mounted at the output facets of the compartments. Lenses $L_1$-$L_9$ collimate, focus or diverge laser beams, thus providing for a desired light propagation scheme.

Such laser modules are useful for the design and integration of optical systems requiring cooling of the light source. They may be installed in different cooling chambers. A laser module approach is more flexible from the design and testability point of view than a conventional technique incorporating the lasers in a cooling chamber in the first step and coupling it to an external dedicated optics in the second step. A cooling system integrated using the conventional technique needs to be redesigned for any change of the system definition and can be tested only at the last stage of integration.

Figure 5A:
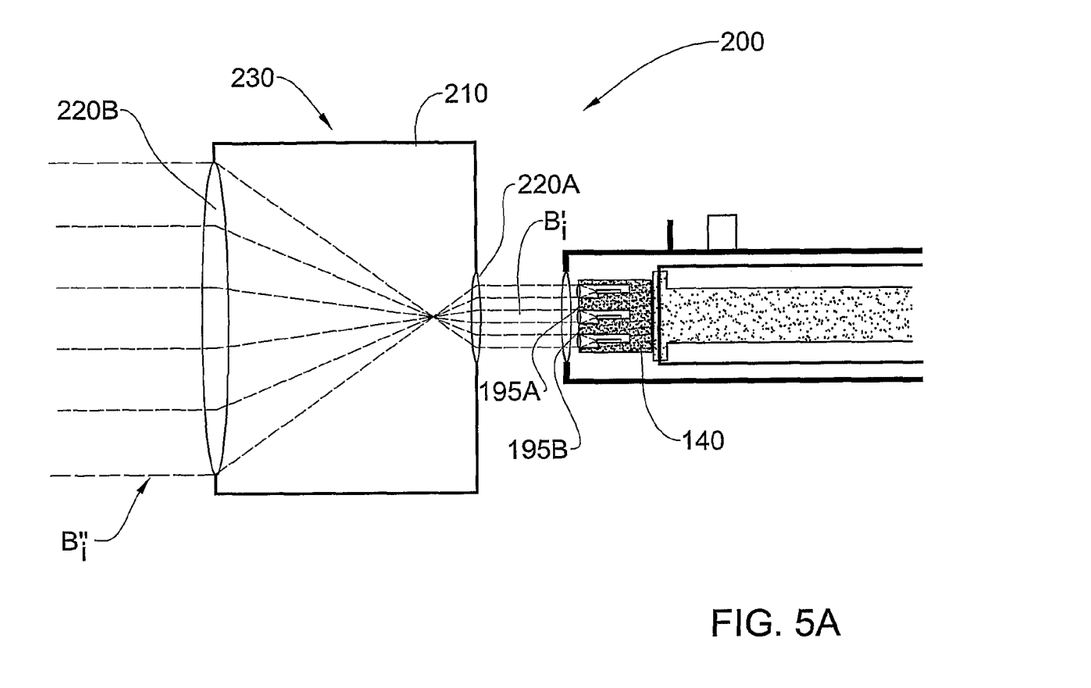
FIGS. 5A and 5B schematically illustrate two examples, respectively, of a cooling system of the present invention for cooling a semiconductor laser based light source, utilizing optics located outside the cooling chamber: a beam expander based on two lenses in FIG. 5A and a beam expander based on mirrors and lenses in FIG. 5B.

Reference is made to FIG. 5A exemplifying a cooling system 300 of the present invention utilizing a beam expander unit 230 accommodated outside the cooling chamber and operating for expanding the cross-sectional dimension (diameter) of an output laser beam beyond the dimension of a cooling chamber. In this example, beam expander unit 230 is a single magnification unit for all the laser beams emerging from the cooling chamber. Magnification unit 230 includes two lenses 220A and 220B, and a magnification unit support assembly 210 holding the lenses aligned with each other. The magnification unit is aligned with the light source located inside the cooling chamber; the magnification unit is held in a correct position and orientation in respect to the cooling chamber by the same magnification unit support assembly 210 or by another support assembly as the case may be. Lenses 220A and 220B are cofocused and positive. Lens 220A is smaller and has a smaller focus than lens 220B. Thus, the widths of beams $B'_i$, emerging from the cooling chamber, are increased when they pass through magnification unit 230, resulting in wider output beams $B''_i$. The design of magnification unit 230 is very simple. However, magnification unit 230 does not utilize the area of lenses 220A and 220B in the best manner, because it images benches 195A and 195B associated with the compartments of assembly 140.

Figure 5B:
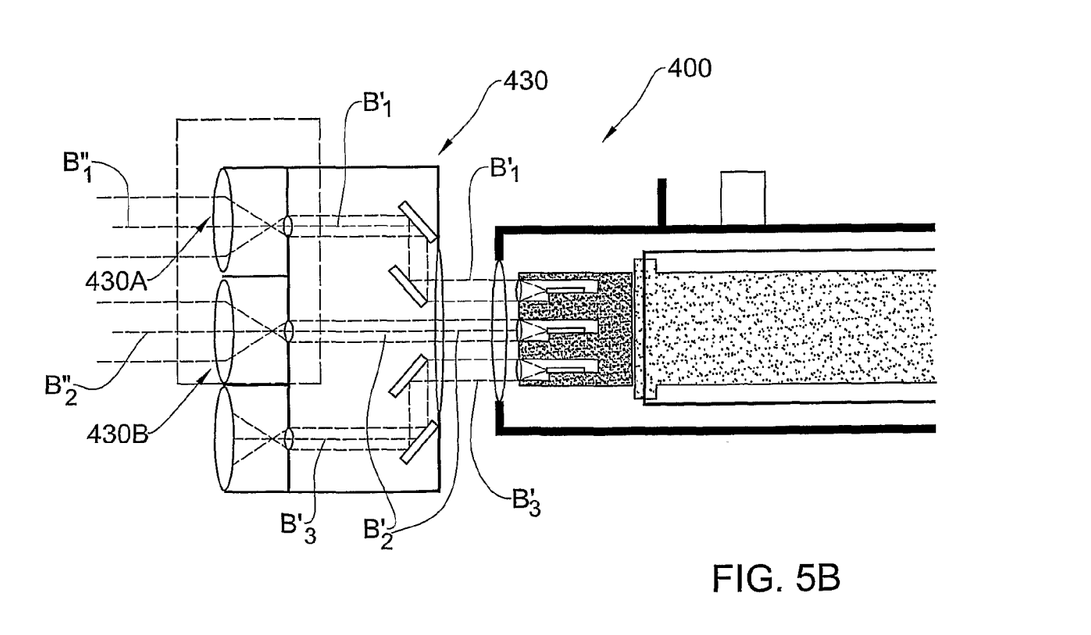

FIG. 5B shows another example of a cooling system 400 utilizing a beam expander unit 430. In this embodiment, the beam expander includes lenses and reflectors. Beam expander 430 is configured to deflect each of beam $B'_1$ and $B'_2$ away from each other to produce output parallel beams $B''_1$ and $B''_2$. This is implemented by sequentially reflecting beam $B'_1$ by a pair of parallel reflectors (mirrors) 420A and 420B. Similarly, beam $B'_3$ is sequentially reflected by another two mirrors. Beam expander 430 defines two magnification units 430A and 430B each including two lenses similar to those in the above-described example of FIG. 5A. The widths of beams $B'_1$ and $B'_2$ are magnified when they pass through these magnification units 430A and 430B as shown in the figure in a self-explanatory manner. The mirrors and/or lenses of the beam expander may be allowed to move, hence a compensation for various alignment and mounting inaccuracies may be provided.

Other beam expander modifications may be used as well, for example a one utilizing three reflectors with their planes being oriented at 90 degrees with respect to each other. This beam expander modification is useful in case when (yet narrow) beams exit the chamber perpendicularly to each other (depending on the support assembly configuration, beams can exit the chamber at different angles of propagation). Three reflectors (e.g. mirrors and/or prisms) of such a beam expander located outside the chamber may be oriented to change the beams' directions to produce output (possibly wide) beams propagating in the same direction. Also, in this modification an original direction of a laser beam (the direction of propagation of a laser beam emerging from the cooler chamber) may be maintained with higher mechanical tolerances to possible misalignments between the cooling chamber and the beam expander unit. To this end, placing the reflectors on a two-rotating axis can be utilized, and misalignments between the laser and the lens within the chamber can be corrected using a close loop correction mechanism tapping the laser light into a collimator. More generally, flexibility of the beam expander designs provides an option to manage the laser beam directions with which they exit the entire system; various configurations of the output beams propagation schemes while exiting the chamber can be dealt with and various inaccuracies in these directions can be compensated for.

Figure 6A:
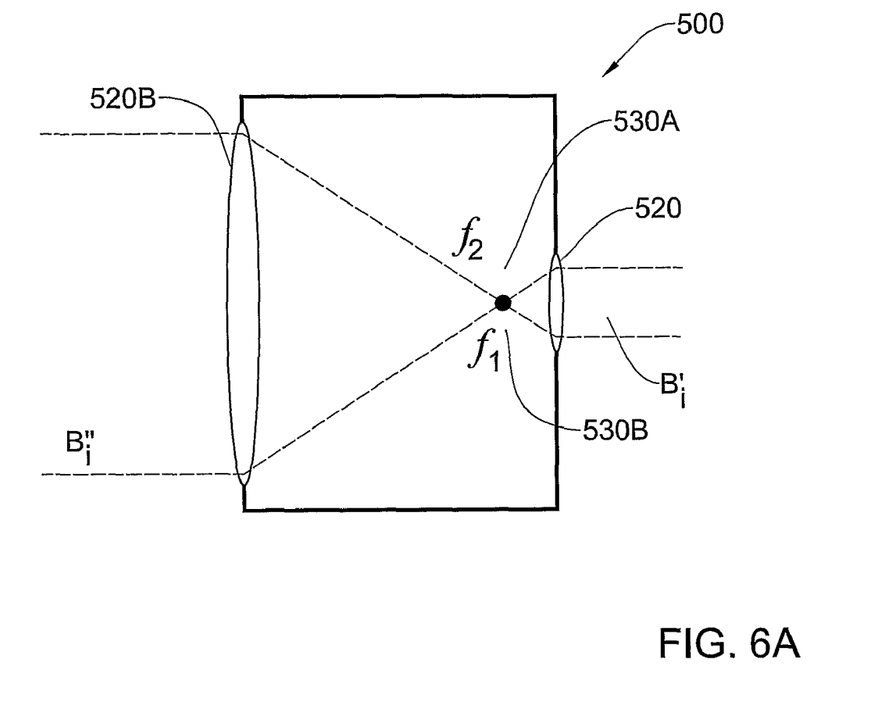
FIGS. 6A and 6B exemplify a beam expander unit suitable to be used in the present invention, configured with a moving lens for modifying the beam divergence.
Figure 6B:
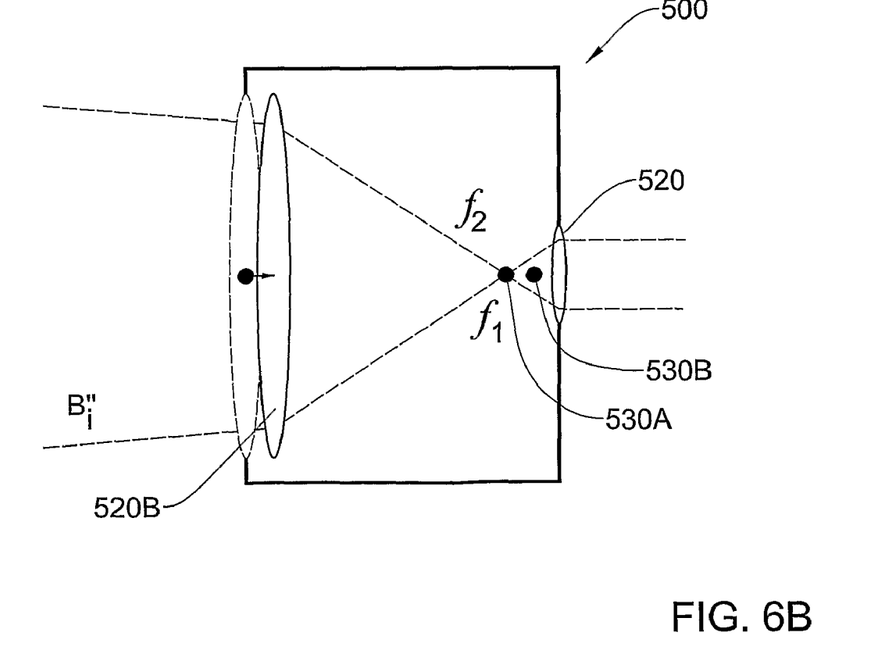

Reference is made to FIGS. 6A and 6B, showing an example of a beam expander 500 which is generally similar to that shown in FIG. 5A, namely formed by two lenses 520A and 520B, but distinguishing therefrom in that beam expander 500 has movable parts. In this embodiment, the beams' divergence at the output of beam expander 500 may be dynamically adjusted by a moving lens 520B. As shown in FIG. 6A, when focal points 530A and 530B of lenses 520A and 520B coincide, passage of a collimated beam $B'_i$ (as emerging from the cooler chamber) through the beam expander results in the remained collimation of an output beam $B''_1$. As shown in FIG. 6B, when lens 520B and accordingly its focus 530B is shifted towards lens 520A, beam $B''_i$ is diverged.

Figure 7A:
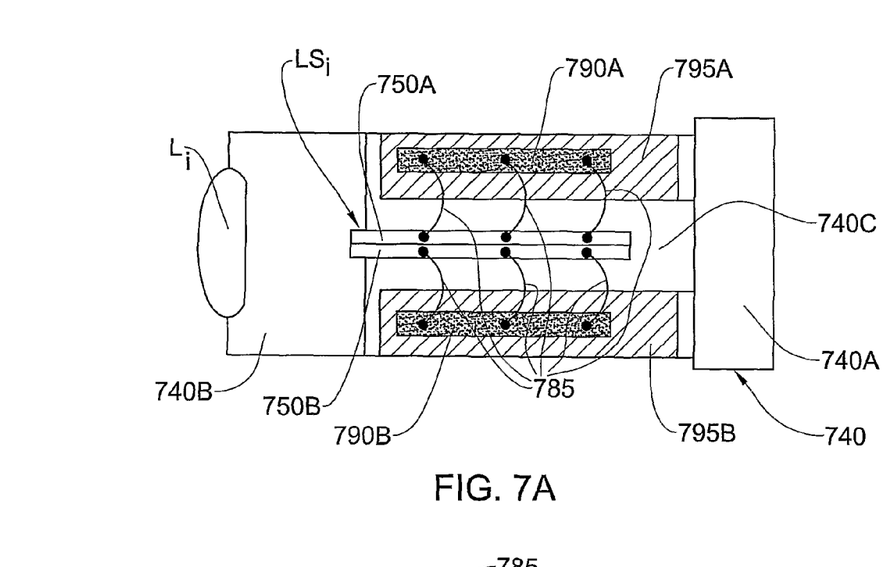
FIGS. 7A, 7B, and 7C show another example of a laser module of the present invention.
Figure 7B:
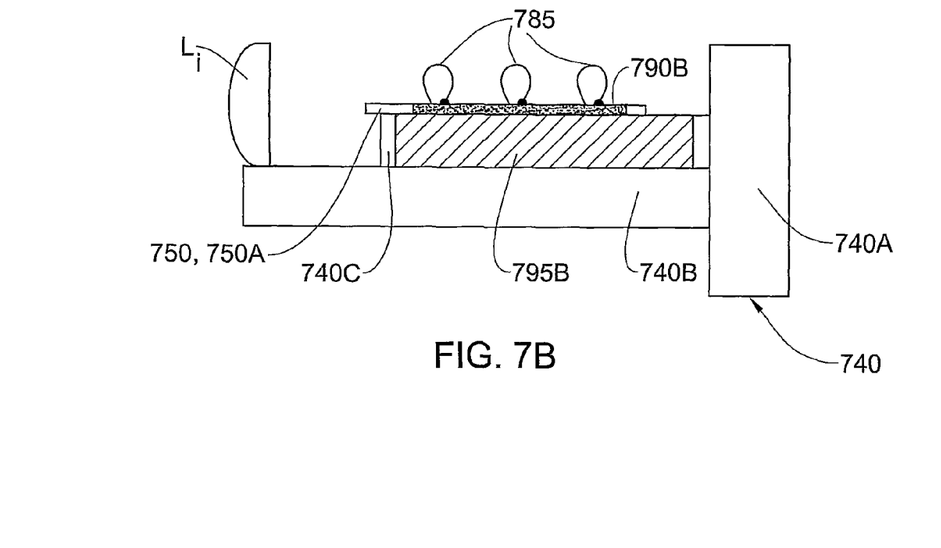
Figure 7C:
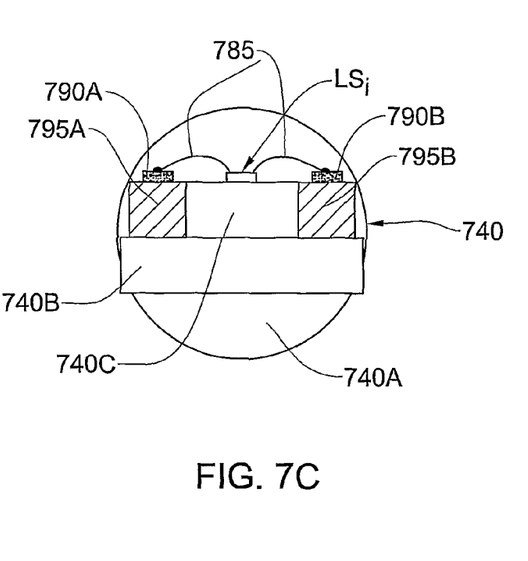

FIGS. 7A-7C show the top, side, and front views of a support assembly 740 suitable to be used in the invention (not to scale). Support assembly 740 carries a laser $LS_i$ (formed by active layers 750A and 750B) and a lens $L_i$ (shown in FIGS. 7A and 7B). The support assembly contains a cylindrical portion 740A, a wide elongated lens-holding portion 740B, and a laser-holding portion 740C. Laser $LS_i$ is connected to thin film electrodes 790A and 790B, lying on electrode carriers 795A and 795B used to isolate the electrodes from the support assembly, by six electrical connections, generally at 785.

In a cooling system, the support assembly is configured to carry out several functions. In particular, it serves as a mechanical support for lenses and lasers, provides the lasers with an electrical feed and serves them as a heat sink. It is also desirable that the support assembly has a small effective thermal expansion coefficient, minimizing a misalignment entailed by heating. The following are some not limiting examples for the materials from which the support assembly may be made: ceramic materials based on BeO, AlN, AlSiC, BN, SiC, SiN, silicon oxide.

Thus, the present invention provides a cooling system for use with a semiconductor laser based light source to improve the performance of the light source. In the cooling system of the present invention, a cooling chamber contains a cooler assembly, multiple semiconductor lasers, and an optical unit. As a result, the system provides for cooling the multiple semiconductor lasers and for affecting the propagation of the multiple laser beams while inside the cooling chamber. The optics inside the cooling chamber or together with optics located outside the chamber provide a desired propagation scheme of the output light.

Those skilled in the art will readily appreciate that various modifications and changes can be applied to the embodiments of the invention as herein described without departing from its scope defined in and by the appended claims.

The invention claimed is:

1. A light projection optical system configured for improved performance, the system comprising a cooling chamber containing: a light source comprising multiple lasers comprising at least one semiconductor laser operative at a cool temperature being lower than 240K; a cooler unit capable of cooling said light source to said cool temperature during the light source operation; an optical window permitting light emergence outside from the cooling chamber; and an optical unit accommodated in the optical path of light emitted by said light source and enabling emergence of this light through said optical window outside from the cooling chamber, the cooling chamber containing a support assembly carrying said optical unit and an array of at least two spaced-apart compartments containing the multiple lasers of the light source.

2. The system of claim 1, wherein the cooling chamber comprises a vacuum sealed housing which contains said light source, the system thereby configured for higher efficiency due to smaller heat transfer to the inside of the vacuum sealed housing by convection.

3. The system of claim 1, wherein said optical unit comprises at least one converging lens.

4. The system of claim 1 wherein said support assembly is mounted on a cool finger thermally coupling the support assembly to said cooler unit.

5. The system of claim 1, wherein said cooling chamber comprises a vacuum housing containing a cold shield assembly configured to absorb thermal radiation emitted by said semiconductor laser and said support assembly, said cold shield assembly being thermally coupled to said cold finger and having a window permitting the passage of said light emitted by said semiconductor laser.

6. The system of claim 1, wherein the optical unit comprises an optical element located at an output facet of said support assembly, the optical element being in the optical path of a light beam emitted by said semiconductor laser.

7. The system of claim 1, wherein the optical unit comprises multiple optical elements located at the output facets of said compartments so as to be in the optical paths of laser beams emitted by said lasers.

8. The system of claim 1, wherein each of said compartments contains an array of the lasers, a corresponding array of the optical elements being located at the output of said compartment.

9. The system of claim 1, wherein said optical unit includes a plurality of lenses.

10. The system of claim 9, wherein each of the lenses is associated with a corresponding one of lasers of the light source.

11. The system of claim 1, wherein said window is oriented in respect to the optical path of the light emitted by said laser with a certain angle preventing light back reflections.

12. The system of claim 1, wherein the optical unit comprises one or more optical elements associated with one or more lasers for affecting the divergence and/or the angle of propagation of one or more laser beams.

13. The system of claim 12, wherein the optical elements carry out one of the following: collimation, focusing, and reducing the beam divergence.

14. The system of claim 13, wherein the optical elements focus at least one laser beam in one or two dimensions.

15. The system of claim 1, wherein said light source comprises multiple semiconductor lasers arranged in a one-, two-, or three-dimensional array.

16. The system of claim 1, wherein said light source comprises at least one monolithic semiconductor laser bar.

17. The system of claim 1, wherein said light source comprises a semiconductor laser emitting in at least one of mid and far infrared wavelength range.

18. The system of claim 1, wherein said light source comprises at least two lasers having substantially different emission spectra.

19. The system of claim 1, comprising an optical fiber unit optically coupled to said optical window of the cooling chamber, the fiber unit comprising at least one multimode fiber collecting at least two of laser beams emitted by multiple lasers.

20. The system of claim 1, wherein said light source emits at least two laser beams and said optical unit projects these beams in at least two substantially parallel laser beams emerging of the cooling chamber.

21. The system of claim 20, wherein said at least two substantially parallel laser beams comprise beams with directions diverging not more than 1 degree.

22. The system of claim 1, wherein said light source emits at least two laser beams and said optical unit focuses said at least two laser beams into intersecting focus spots.

23. The system of claim 1, comprising a light beam expander unit accommodated at a light output of the cooling chamber outside thereof and configured to carry out at least one of the following: diverging a light beam projected from the cooling chamber or increasing the light beam width.

24. The system of claim 1, comprising a light beam expander unit accommodated at a light output of the cooling chamber outside thereof and configured to carry out at least one of the following: converging a light beam projected from the cooling chamber or decreasing the light beam width.

25. The system of claim 23, wherein the beam expander unit comprises first and second sets of deflectors, the first set of deflectors operating for directing light beams emerging from said cooling chamber onto the second set.

26. The system of claim 1, wherein said light source comprises a semiconductor laser emitting in 3-5 micron wavelength range.

27. The system of claim 1 wherein said light source comprises a Quantum Cascade Laser.

28. The system of claim 1, wherein said light source comprises an InP based laser with AlInAs/GaInAs active layers.

29. The system of claim 1, wherein said cooling unit is a cryogenic Stirling cooling unit.

30. The system of claim 1, wherein said cooling unit is a cryogenic Joule-Thompson cooling unit.

31. The system of claim 1, wherein said cooling unit is a cryogenic Pulse Tube cooling unit.

32. The system of claim 1, wherein said cool temperature is lower than 170K.

* * * * *